United States Patent [19]

Wang

[11] 4,290,030
[45] Sep. 15, 1981

[54] ATOMIC FREQUENCY STANDARD USING FREE INDUCTION TECHNIQUE

[75] Inventor: Harry T. Wang, Thousand Oaks, Calif.

[73] Assignee: Hughes Aircraft Company, Culver City, Calif.

[21] Appl. No.: 43,075

[22] Filed: May 29, 1979

[51] Int. Cl.³ .............................................. H03L 7/26
[52] U.S. Cl. .......................................... 331/3; 331/14
[58] Field of Search ................................ 331/3, 94, 14

[56] References Cited

U.S. PATENT DOCUMENTS 3,234,483 2/1966 Arditi ................................ 331/94 X
4,122,408 10/1978 Walls ........................................ 331/3

OTHER PUBLICATIONS

Walls et al., "A new Kind of Passively Operating Hydrogen Frequency Standard", Conference Proceedings of the 30th Annual Symposium on Frequency Control, Atlantic City, N.J. 2–4 Jun. 1976, pp. 473–480.

Primary Examiner—Siegfried H. Grimm
Attorney, Agent, or Firm—Robert M. Wallace; William H. MacAllister

[57] ABSTRACT

In the free induction technique of this invention, the maser is externally stimulated to allow significant reduction of the size of the maser, and the stimulation is turned off and allowed to decay so that the maser output is free from the external stimulation before the signal is sensed to provide a clock frequency standard. As a result, the invention solves significant problems which otherwise have limited the accuracy of prior art atomic clocks, including the problem of frequency pulling due to amplitude drift in the stimulation signal.

21 Claims, 4 Drawing Figures

ATOMIC FREQUENCY STANDARD USING FREE INDUCTION TECHNIQUE

TECHNICAL FIELD

This invention relates to atomic clocks, and in particular, atomic clocks using a hydrogen maser in which the atomic transition is externally stimulated.

BACKGROUND ART

U.S. Pat. No. 3,209,280 for Atomic Storage Cell For Atomic Hydrogen Maser by Robert Vessot and Norman Ramsey and U.S. Pat. No. 3,255,423 for Atomic Hydrogen Maser, both by Norman Ramsey and Daniel Kleppner and U.S. Pat. No. 3,388,342 for Atomic Hydrogen Maser With Enlarged Atom Storage Container by Norman Ramsey disclose a hydrogen gas maser atomic clock. Prior art hydrogen gas masers useful with atomic clocks operate on the hyperfine transition frequency $f_0$ of atomic hydrogen, which is 1.42040575168 gigahertz. Such hydrogen gas masers provide extremely accurate clock standards because the hyperfine transition of ground state atomic hydrogen has a very narrow line width of the order of 1 hertz. If the hydrogen hyperfine transition is not externally stimulated, losses in the maser cavity must be sufficiently low such that the power radiated by the atoms would overcome cavity losses and oscillation can be sustained. Such low-loss narrow band width cavities have a relatively large size of the order of the wavelength of the radiation or 21 cm. The low loss cavity required to sustain oscillation is not necessary if the hydrogen is externally stimulated. In some prior art hydrogen gas maser clocks, the atoms are stimulated to radiate by continuous wave stimulation with a phase modulated resonant radiation synthesized from a voltage controlled crystal oscillator (VCXO), typically at 5 MHz. The radiation of the hydrogen gas in the maser is coherently detected and an error voltage proportional to the frequency difference between the atom transition frequency and the frequency of the stimulating signal is used to servo the VCXO. The VCXO output thus serves as a hydrogen atom resonance controlled frequency standard. One difficulty with such prior art devices is that the coherent emission from the hydrogen must be sensed in the presence of the stimulating signal. As a result, frequency pulling may occur whenever the amplitude of the stimulating signal drifts. Furthermore, phase drifts in the sensing electronics will introduce systematic errors. Significant frequency pulling is also produced when the cavity resonant frequency drifts out of tune.

Another disadvantage in such prior art devices is that the frequency synthesizer used to generate the continuous wave stimulating signal must have high resolution and stability in its output. Fluctuations both in frequency and amplitude in the synthesizer output will degrade the clock performance. Thus, it is apparent that the accuracy of such prior art atomic clocks place stringent stability requirements on the electronics.

SUMMARY OF THE INVENTION

In the present invention, the foregoing difficulties of the prior art are overcome by using pulsed stimulation of the hydrogen transition. In this invention, the stimulation is turned off and is allowed to decay before the maser output is sensed by the clock receiver electronics. Therefore, the frequency pulling effect due to stimulating signal amplitude variations, discussed above in connection with prior art hydrogen gas maser clocks, does not occur during the time window that the clock receiver electronics senses the radiation from the maser. Therefore, in this invention the problem of frequency pulling due to amplitude variations of the stimulating signal is solved. Since the atom radiation signal is detected and processed in the absence of external stimulation, frequency pulling due to cavity drift is much smaller. The pulsed stimulation has a continuous spectrum with a center frequency near $f_0$ and a bandwidth equal to the reciprocal of the time domain width of the pulse. As a result, the center frequency of the spectrum need not be precisely $f_0$ to assure stimulation of the hyperfine transition in the hydrogen gas. Moreover, since the determination of the hyperfine transition frequency occurs in the absence of the stimulating signal, the resolution and stability of the frequency synthesizer generating the stimulating signal is considerably relaxed. By comparison, in the continuous wave stimulation of the prior art, variations in amplitude and frequency due to the frequency synthesizer will introduce clock error.

In this invention, after each stimulating pulse, the exponentially decaying maser output signal of frequency $f_0$ is down converted to a frequency of 5.751 KHz by mixing with local oscillators at 1.4 GHz and 20.4 MHz which are phase-locked to the 5 MHz output of the reference VCXO. The 5.751 KHz signal is counted in a high resolution presettable up/down counter for a predetermined number of zero crossings of the signal. The number of zero crossings counted is determined by the signal to noise ratio of the signal which depends on the signal decay time constant. A longer signal decay time constant corresponding to a narrower atomic transition line width permits more zero crossings to be counted and consequently more precise frequency determination. The use of an up/down counter enables a simple technique of signal averaging. The time base of the counter is also phase locked to the reference VCXO. The residue of the up/down counter is fed to a high resolution digital-to-analog converter to servo the reference VCXO. Thus, the VCXO is an atomic hydrogen resonance controlled frequency standard. Advantageously, the feedback loop is responsive only to frequency and therefore is unaffected by phase drift in the electronics, unlike the prior art discussed above.

Significantly, this invention permits a radical reduction in the size of the maser cavity heretofore unknown in the prior art of oscillating masers. This is because the oscillation condition that the power radiated by the atoms be sufficient to overcome losses in the cavity need not be satisfied. Consequently, the maser cavity and hence the overall size may be made compact with corresponding reduction in weight. In a particular embodiment of this invention, the maser size has been reduced by a factor of more than two. This was accomplished by using a maser cavity 6 inches in diameter by 6 inches long compared to 11 inches in diameter by 11 inches long low loss cavity in an oscillating maser. The fractional transition linewidth was 1 part in $10^9$ by using a relatively large atom storage bulb of 3 inches in diameter by 4 inches long. However, this is not the limit of size reduction. Smaller cavities can be used with correspondingly smaller size and larger atom transition linewidth.

DETAILED DESCRIPTION OF THE INVENTION

Figure 1:
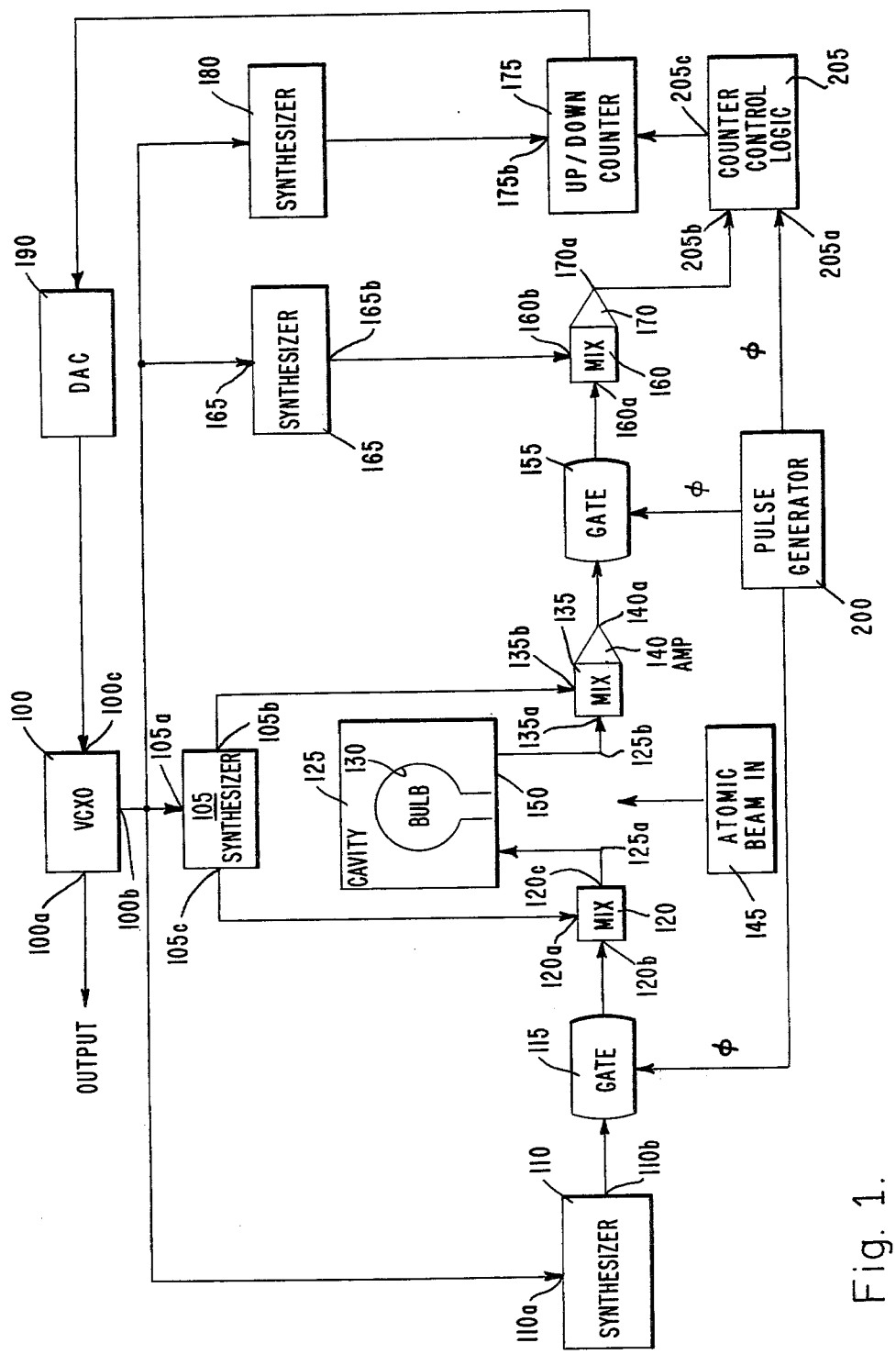
FIG. 1 is a simplified schematic diagram of the preferred embodiment of this invention.

FIG. 1 illustrates in a simplified schematic manner the preferred embodiment of the present invention. A voltage controlled crystal oscillator (VCXO) 100 having a nominal output frequency of 5 megahertz has output terminals 100a, 100b and a voltage control input 100c. The voltage present on the voltage control input 100c controls the frequency of the output produced on outputs 100a, 100b in a manner well known to those skilled in the art. A frequency synthesizer 105 is provided and has its input 105a connected to VCXO output 100b. The synthesizer 105 multiplies the nominal 5 megahertz output of the VCXO 100 to a nominal value of 1.4 gigahertz. The synthesizer 105 outputs the 1.4 gigahertz signal at its outputs 105b, 105c. A frequency synthesizer 110 has its input 110a connected to VCXO output 100b. The frequency synthesizer 110 generates a 20.405751 megahertz signal phase locked to the VCXO 100. The signal from the frequency synthesizer 110 passes through output 110b through a normally open electronic gate 115. A mixer 120 receives the 1.4 gigahertz signal from the frequency synthesizer 105 through its input 120a and receives the 20.4 megahertz signal from the gate 115 through its input 120b. The frequency sum of the 1.4 gigahertz signal and the 20.4 megahertz signal appears on output 120c of the mixer 120. Therefore, the signal appearing on the output 120c of the mixer 120 contains a nominal frequency of 1.420405751 gigahertz. The maser cavity 125 includes an atom storage bulb 130, shown in simplified schematic form only. The storage bulb 130 contains hydrogen gas. An atomic beam source 145 well known in the prior art supplies the hydrogen gas to the storage bulb 130 through atomic beam entrance 150. The atomic beam source 145 preferably includes a static magnetic field source surrounding the atomic beam which selects hydrogen atoms having a particular magnetic spin orientation in a manner well known in the art. The maser cavity is defined by a conductive enclosure, typically a copper coating. The maser cavity 125 has an input 125a connected to the output 120c of the mixer 120. The 1.420405751 gigahertz signal from the mixer output 120c passes through the maser input 125a and is introduced into the maser cavity. The maser cavity 125 also has an output 125b through which signal from the maser can be coupled out. Another mixer 135 has its input 135a connected to the maser output 125b. Input 135b to the mixer 135 is connected to output 105b of frequency synthesizer 105. The mixer 135 mixes the signal from maser output 125b with the 1.4 gigahertz signal from frequency synthesizer 105 output 105b. An amplifier 140 having a tuned output receives the resulting mixed signal from mixer 135. The frequency difference between the 1.4 gigahertz signal of frequency synthesizer output 105b and the maser signal from maser output 125b is output by the tuned amplifier at output 140a. The tuned amplifier 140a is tuned to pass the frequency difference signal in the mixer 135.

The signal from tuned amplifier output 140a passes through a normally closed electronic gate 155 into mixer input 160a of mixer 160. A frequency synthesizer 165 is provided which has its input 165a connected to VCXO output 100b. The frequency synthesizer 165 multiplies the nominal 5 megahertz output signal of the VCXO 100 to 20.4 megahertz and outputs this signal on frequency multiplier output 165b. Mixer 160 receives the 20.4 megahertz signal from synthesizer output 165b through mixer input 160b. The signal corresponding to the difference frequency of the inputs at 160a and 160b of the mixer 160 is fed to the tuned amplifier 170. The output signal R at tuned amplifier output 170a is illustrated in FIG. 2 and represents the frequency difference between the signal from the maser output 125b and a nominal frequency of 1.4204 Ghz.

This signal on tuned amplifier output 170a is utilized to generate a corrective feedback signal sent to voltage control input 100c as follows. A presettable up-down counter 175 which has its clock timing input 175b connected to a frequency synthesizer 180 is provided. The frequency synthesizer 180 is connected to VCO output 100b and multiplies the nominal 5 megahertz output of the VCO to 100 megahertz. The 100 megahertz signal from frequency synthesizer 180 enters the timing control input 175b as a time base clock signal for the up-down counter 175.

Figure 2:
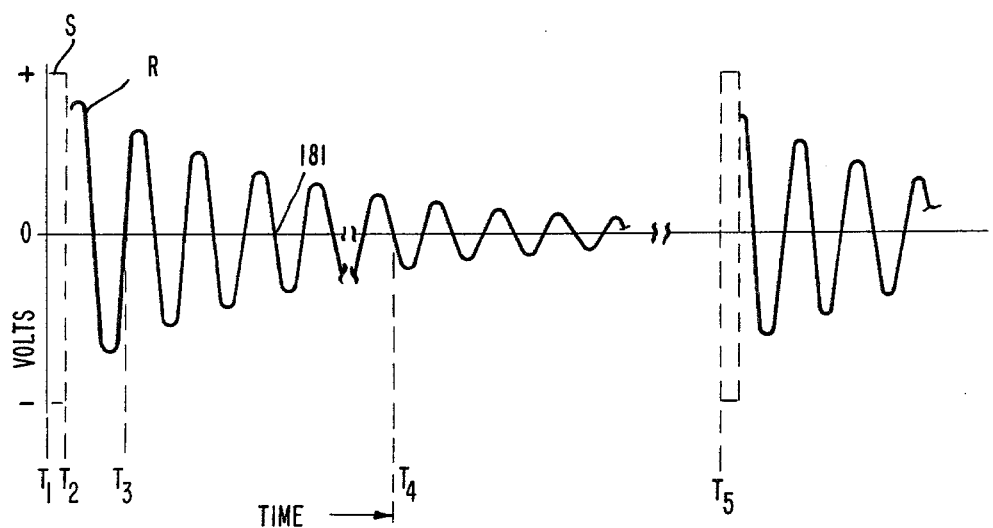
FIG. 2 is a figurative diagram of the time domain wave forms of the difference signal derived from the output of the maser of FIG. 1, and also illustrates the timing of the stimulating pulse introduced into the maser of FIG. 1.

The up-down counter 175 operates to count the number of 100 megahertz pulses received from the frequency synthesizer 180 between a preselected number of zero crossings 181 of the difference signal R from tuned amplifier output 170a illustrated in FIG. 2. The residue accumulated in up-down counter 175 is sent as digital data to digital-to-analog converter 190. The digital-to-analog converter 190 preferably has a high resolution, such as 20 bits and an analog output range to match the voltage tuning range of the VCXO, typically between 0 and 10 volts. The digital-to-analog converter 190 converts each accumulated count into a corresponding voltage level. This voltage level is then furnished to VCO voltage control input 100c It is now apparent that the system illustrated in FIG. 1 includes a closed feedback control loop comprising the voltage control oscillator 100, the synthesizer 105, the maser 125, the mixer 135, the mixer 160, the synthesizer 180 generating the time base clock signal for the up-down counter 175.

Logic contol circuitry is provided which temporarily deactivates operation of this feedback control loop whenever the maser 125 is externally stimulated, in accordance with the free induction technique of this invention. A pulse generator 200 generates a clock signal $\phi$ controlling electronic gates 115 and 155. Pulse generator 200 also transmits the clock signal $\phi$ to input 205a of control logic device 205. The control logic device 205 also receives the output difference signal of FIG. 2 from tuned amplifier output 170a through input 205b.

Operation of the system of FIG. 1 will now be explained by simultaneous reference to FIGS. 1, 2 and 3. Generation of the stimulating pulse S shown in FIG. 2 at mixer output 120c is as follows. Initially, the VCXO 100 outputs a 5 megahertz signal at output 100b. Frequency synthesizer 105 multiplies this signal to 1.4 gigahertz and introduces it into mixer 120. The electronic gate 115 is normally open, and therefore the mixer 120 normally receives only a 1.4 gigahertz input signal. This signal is not transmitted by the maser cavity 125 since it is far from the cavity resonance frequency. In any case, the 1.4 gigahertz signal is not sufficiently close to $f_0$, the ground state hyperfine transition frequency of 1.42040575168 gigahertz, to stimulate the hyperfine transition in the hydrogen gas. Consequently, there is no emission from the hydrogen gas inside maser cavity 125.

Figure 3:
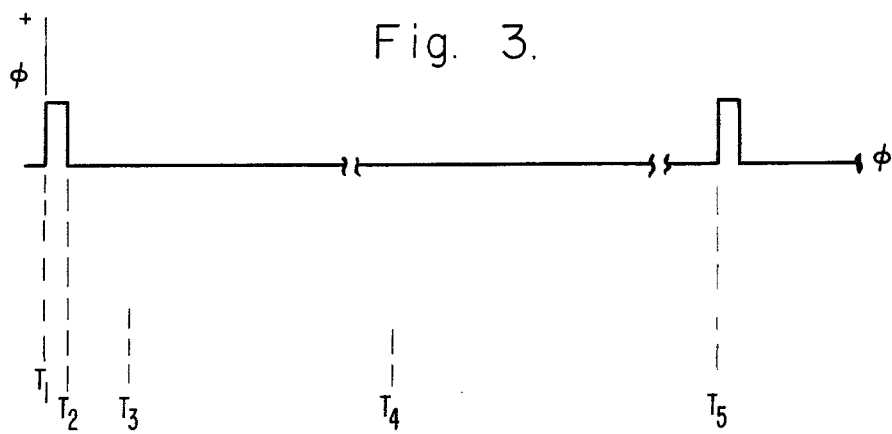
FIG. 3 is a diagram of the time domaine wave form of the signals from the pulse generator of FIG. 1.

At time $T_1$, as illustrated in FIG. 3, the clock signal $\phi$ is pulsed positively. Therefore, at time $T_1$, electronic gate 115 is closed, thereby allowing the 20.405751 megahertz signal from frequency synthesizer 110 to enter mixer input 120b. Also, at time $T_1$ gate 155 is opened, which isolates the feedback loop. Mixer 120 causes the frequency sum of the 1.4 gigahertz signal from frequency synthesizer 105 and the 20.405751 megahertz signal from frequency synthesizer 110 to enter the maser cavity 125 through maser input 125a as a nominal 1.420405751 gigahertz signal. The resulting 1.420405751 gigahertz stimulation signal S is shown in FIG. 2 and has a frequency band width determined by the pulse width of $\phi$ and therefore contains a frequency component at the exact frequency $f_0$ of the hyperfine transition of the hydrogen gas. Therefore, at time $T_1$, the hydrogen atoms inside the storage bulb 130 start to radiate as a result of the introduction of the stimulating signal S illustrated in FIG. 2. Subsequently, at time $T_2$, $\phi$ returns to zero amplitude and the electronic gate 115 becomes open, while gate 155 closes, thereby permitting the output of the maser to reach the feedback loop. Therefore, the frequency of the output signal on mixer output 120c introduced into maser input 125a returns to the nominal 1.4 gigahertz frequency, which, as discussed above, is not sufficiently close to the transition frequency $f_0$ of the hydrogen gas inside the storage bulb 130. Therefore, the hydrogen gas is no longer excited by the signal from mixer output 120c. However, the stimulating pulse which lasted from time $T_1$ to time $T_2$ succeeded in creating a population of radiating hydrogen atoms in the storage bulb 130 and these atoms radiate energy at the hyperfine transition frequency. The radiation from the hydrogen atoms in the storage bulb 130 resonates inside the cavity 125 so that the signal at maser output 125b has a frequency equal to the hyperfine transition frequency $f_0$. The resulting exponential decay of the maser output causes exponential decay of the difference output response R of FIG. 2. The resonance of the stimulation signal S in the cavity 125 decreases so rapidly that it has a decay envelope which is not observable in the time scale of FIG. 2.

The 1.4 gigahertz signal from synthesizer 105 is fed into mixer 135, where it is subtracted from the maser output signal frequency $f_0$, and the difference frequency then appears on tuned amplifier output 140a. The output from mixer 135 is subtracted in mixer 160 from the 20.4 megahertz signal generated by synthesizer 165, and the difference appears on tuned amplifier 170a. If it is assumed that the VCXO 100 is generating a signal at the precise frequency of 5 megahertz, it is seen that the signal on maser output 125b at time $T_3$, which has the frequency of 1.42040575168 gigahertz, is subtracted from the 1.4 gigahertz signal in mixer 135 and the resulting signal is then subtracted from the 20.4 megahertz signal in mixer 160. The resulting response, +R, which is illustrated in FIG. 2, appears at tuned amplifier output 170a, and has a relatively low frequency of 5.75168 kilohertz. FIG. 2 shows that the resonance signal R decays exponentially as soon as the signal S is turned off at time $T_2$. Processing of the signal R occurs during the time window from $T_3$ and $T_4$ during which there is no external stimulation. At time $T_5$, after the signal R has decayed to zero, a new stimulation pulse S occurs, and the entire foregoing sequence is repeated. The stimulation pulses S are repeated at a selected interval throughout the entire operation of the invention, and each stimulation signal S is followed by a new response signal R, which in turn must be processed by the control logic 205.

Processing of each response signal R from tuned amplifier output 170 will now be described. The counter control logic 205 receives the clock pulse signal $\phi$ from pulse generator 200 at time $T_1$. At the termination of the clock signal $\phi$ at time $T_2$ the counter control logic 205 delays from time $T_2$ until time $T_3$ before enabling the updown counter 175. During the delay from time $T_2$ to time $T_3$, transient noise from stimulating signal S decays down to nearly zero amplitude. Counter control logic 205 receives the response signal R from tuned amplifier output 170 through the input 205b. At time $T_3$, the control logic 205 senses each zero crossing 181 of the response signal R. As soon as the first zero crossing 181 is sensed after time $T_3$, the control logic 205 enables the updown counter 175, and therefore the updown counter 175 begins to accumulate counts of 100 megahertz pulses received from the synthesizer 180. The control logic 205 may be preset to a certain value $\eta$, which, for example, may be equal to a 1,000, so that as soon as the control logic 205 has sensed 1,000 zero crossings 181 in the response signal R, the control logic 205 disables updown counter 175 so that the counter 175 stops counting at time $T_4$. Thus, it is seen that the operation of the control logic 205 causes the updown counter 175 to count the number of 100 megahertz pulses from synthesizer 180 which occurs during an interval defined by 1,000 zero crossings of the response signal R. It is apparent that if the oscillator 100 is precisely adjusted such that the frequency of the response signal R of FIG. 2 is precisely 5751.680 hertz, it will take precisely 0.17386225 seconds for the 1,000 zero crossings to occur. Therefore, in this exemplary situation counter 175 will be enabled for exactly 0.17386225 seconds and will count precisely 17,386,225 pulses from 100 megahertz synthesizer 180.

Figure 4:
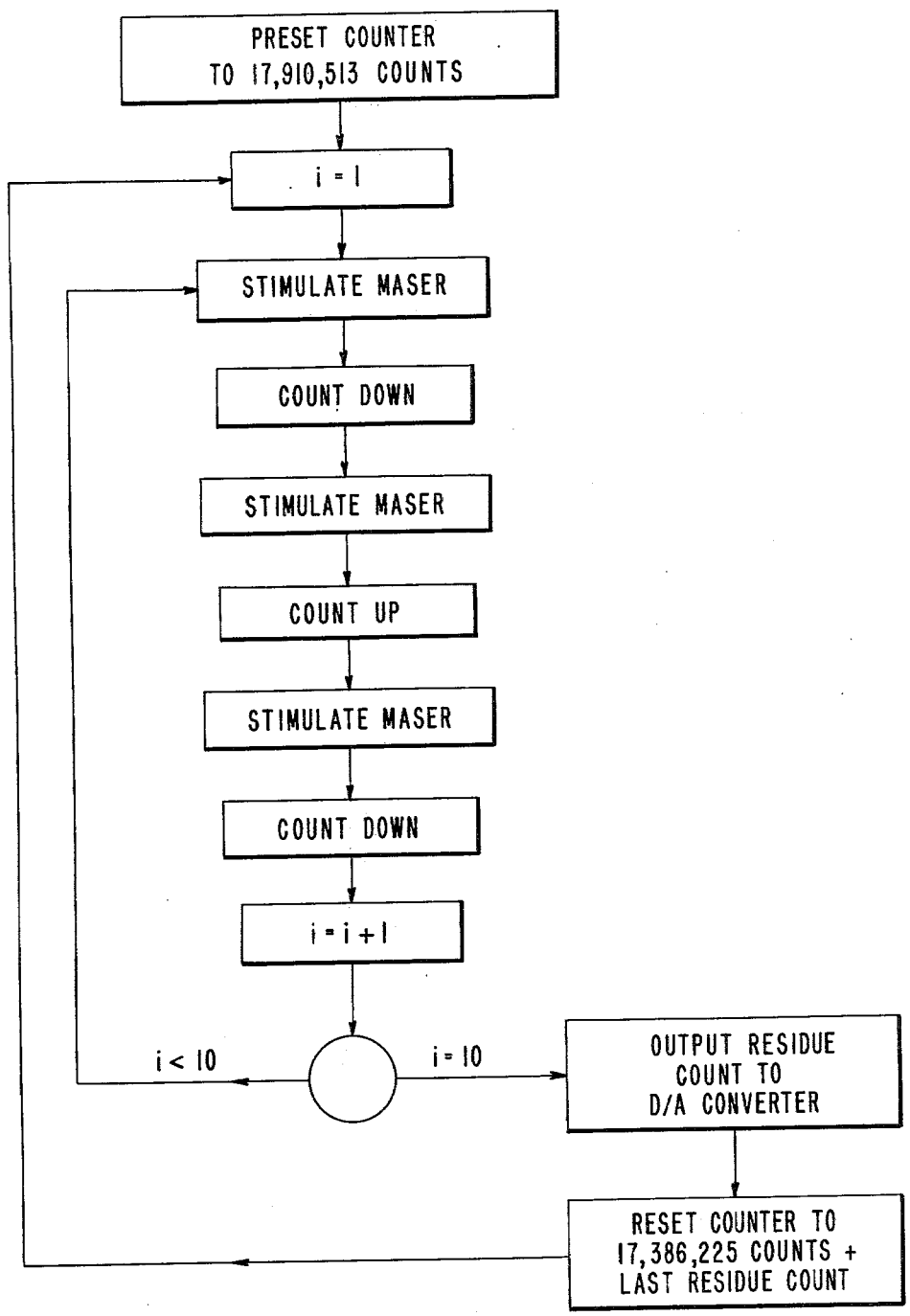
FIG. 4 is a block diagram illustrating the operation of the up/down counter of FIG. 1.

FIG. 4 illustrates the operation of the counter 175 in block diagram form. The counter 175 is preset to a particular count, preferably 17,910,513 counts, as will be explained below. Upon the occurrence of the first stimulation signal S, the counter 175 down counts the number of pulses received from the synthesizer 180 from the preset number during the time interval from $T_3$ to $T_4$. Upon the occurrence of the next stimulation signal S, a new response signal R is generated and the counter 175 counts up during the time interval defined by 1000 zero crossings of the new signal R. Upon the occurrence of the next stimulation signal S, the counter 175 again down counts. This sequence is then repeated $\eta$ times as shown in FIG. 4. $\eta$ may preferably be equal to 10 or more. The resulting count or counter residue is output as binary information to the 20 bit digital to analog converter 140 to servo the VCXO 100. The counter 175 is then reset by adding 17,386,225 counts to the last residue count stored in the counter 175, as shown in FIG. 4. Initially, before the occurrence of the first stimulation signals, in order to optimize the operation of the loop and provide maximum possible voltage swing at the control voltage input 100C, the converter 140 preferably generates an analog output voltage in the middle of the voltage tuning range of the VCXO 100. Assuming the VCXO 100 has a 0–10 volt input range, the counter 175 is preset with 17,910,513 counts. In the exemplary situation, if the voltage controlled oscillator 100 is precisely tuned to 5 MHz so that the output from the synthesizer 180 is precisely 100 megahertz, the counter 175 will downcount from the preset value of 17,910,513 counts at time $T_3$ to 524,288 counts at time $T_4$ (precisely 0.17386225 seconds later). The resulting 524,288 count is exactly in the middle of the 20 bit input range of the converter 140.

As discussed previously, in the specification, the digital to analog converter 140 has a digital input range of 20 bits and an analog output range from zero to 10 volts. The digital input to the converter 140 causes a corresponding analog voltage level to be output from the converter 140 into the control voltage input 100C of the oscillator 100. In the exemplary situation discussed above, counter 175 accumulates a count of 524,288 counts and the digital input to the converter 140 is precisely at the middle of its digital range of 20 bits. Therefore, the analog output from the converter 140 will be 5 volts, precisely in the middle of its zero to 10 volt analog output range. The 5 volt analog output signal furnished by the converter 140 to the control voltage input 100C stabilizes the output frequency of the oscillator 100 at precisely 5 MHz. The output frequency of oscillator 100 may drift from the desired 5 MHz frequency. If the frequency of the oscillator 100 should happen to increase from 5 MHz, the frequency of the synthesizer 180 will also increase above its nominal 100 megahertz frequency. Moreover, the frequency of the signal at counter control logic input 205b will be lower. As a result, the counter 175 will count more pulses from synthesizer 180 during the subsequent time interval in which a new response signal R has 1,000 zero crossings sensed by control logic 205. Therefore, at the end of this time interval when the counter 175 has downcounted from the preset value of 17,910,513 counts, it will output a digital count to converter 140 which is less than the exemplary level of 524,288 counts. It is apparent that the count will be reduced from the exemplary level of 524,288 counts in proportion to the increase in the output frequency of the oscillator 100. The reduced number of counts furnished by the counter 175 as digital input to the converter 140 will cause a corresponding decrease in the analog output of the converter 140 from its midrange 5 volt level. Therefore, the converter 140 will supply a reduced voltage level to the control voltage input 100c causing a corresponding decrease in the output frequency of the oscillator 100. With the occurrence of subsequent response signals R, the analog output from the converter 140 to the control voltage input 100c will remain below the 5 volt midrange level of the converter 140 to servo the frequency of the oscillator 100 to precisely 5 megahertz.

The frequency of the oscillator 100 may also decrease from the desired output frequency of 5 megahertz. When the frequency of the oscillator 100 decreases, the frequency of the 100 megahertz synthesizer 180 will also decrease below 100 megahertz and the response signal R will have a higher frequency. As a result, counter 175 will accumulate fewer counts during the interval from time $t_3$ to time $t_4$ defined by the occurrence of 1,000 zero crossings in the response signal R. Therefore, counter 175 will downcount from the preset level of 17,910,513 counts to a count which is greater than the midrange level of 524,288 counts. Therefore, this increased digital count will be output from the counter 175 to the input of converter 140. The increase in digital input to the converter 140 will cause a corresponding increase in the analog output signal from the 5 volt midrange level. The increase in analog output voltage above the midrange 5 volt level is directly proportional to the decrease in the output frequency of the oscillator 100. The increased analog voltage is input at control voltage input 100c and causes the frequency of the oscillator 100 to increase. With the occurrence of subsequent response signals R, the analog voltage input to control voltage 100c remains above the 5 volts midrange level to slew the frequency of oscillator 100 back to the desired 5 MHz value.

As discussed above, the up-down counter 175 operates only in the time window between $T_3$ and $T_4$ when the maser is completely free of the external stimulation signal S. Inasmuch as this time window may be preferably as long as possible, it is not necessary that the maser cavity 125 have a high Q which will sustain the oscillation of the radiation from the hydrogen gas. Advantageously, the maser cavity 130 may therefore be of reduced volume and weight. The reduced volume of the maser makes the atomic clock of this invention useful in applications where a small size is required, such as in space flight vehicles. However, it should be clearly recognized that this invention is not limited to a particular maser cavity design, but may be used with any suitable cavity design.

Thus, it is seen that, in the free induction technique of this invention, the maser is externally stimulated to allow significant reduction of the size of the maser, and that the stimulation is turned off and allowed to decay so that the maser output is free from the external stimulation before the signal is sensed to provide a clock frequency standard. As a result, the invention solves significant problems which otherwise have limited the accuracy of prior art atomic clocks, including the problem of frequency pulling due to amplitude drift in the stimulation signal. The invention permits sensing frequency differences exclusively, thereby solving the problem of systematic phase drift errors.

I claim:
1. A maser atomic frequency standard clock comprising:
   a microwave cavity;
   an oscillator generating an oscillator signal;
   an atom storage bulb in said cavity;
   means for injecting atoms of a selected magnetic spin orientation into said storage bulb;
   means for stimulating coherent emission from said atoms referenced to said oscillator signal;
   pulsing means for temporarily connecting said stimulating means to said cavity during a first time period and then disconnecting said stimulating means from said cavity for a second time period;
   means for sensing said coherent emission during said second time period exclusively, whereby said sensing means generates a maser output signal having a phase and frequency which is substantially unaffected by said stimulating means;
   means for comparing the frequency of said maser output signal with the frequency of said oscillator signal to generate a difference signal in response thereto; and means for changing the frequency of said oscillator signal so as to null said difference signal.

2. The atomic clock of claim 1 wherein said stimulating means comprises a pulse generator means having a pulse width equal to said first time period, said pulse width corresponding to a frequency bandwidth.

3. The atomic clock of claim 1 wherein said stimulating means increases the population of excited atoms radiating coherent emission during said first time period, and said population decreases during said second time period.

4. The atomic clock of claim 3 wherein said storage bulb has a geometry corresponding to a resonance linewidth, and said population decreases exponentially during said second time period in proportion to said resonance linewidth.

5. The device of claim 1 wherein said sensing means includes logic circuit means for preventing said sensing means output signal during said first duration of time.

6. The atomic clock of claim 1, wherein said stimulating means comprises:

frequency synthesizer means referenced to said oscillator having a final output frequency near the frequency of said coherent emission;

and wherein said comparing means comprises:

means for subtracting one of said synthesizer output frequency and the frequency of said coherent emission from the other for generating said difference signal;

and wherein said changing means comprise means for applying a voltage representative of said difference signal to said osillator so as to control the frequency of said oscillator.

7. The atomic clock of claim 6 wherein said stimulating means further comprises pulse generator means for gating the output of said frequency synthesizer means to said cavity, said first time duration defining the pulse width of said pulse generator means.

8. The atomic clock of claim 1 wherein said pulsing means includes a pulse generator, and wherein said stimulating means synthesizes said oscillator signal to generate a stimulation signal, said stimulation signal being introduced into said cavity in synchronism with said pulse generator.

9. The device of claim 8 wherein said stimulating means further comprises frequency synthesizer means for generating said stimulation signal from said oscillator signal; and said pulsing means further comprises gate means for controlling the output of said stimulation signal from said frequency synthesizer means to said cavity in synchronism with said pulse generator.

10. The device of claim 9 wherein said pulse generator has a pulse width equal to said first time period.

11. The device of claims 9 or 10 wherein said frequency synthesizer means delivers a signal of a first frequency to said cavity when said gate means is non-conductive and delivers a signal of a second frequency to said cavity when said gate means is conductive, said second frequency being closer to the frequency of said coherent emission than said first frequency to stimulate said coherent emission.

12. The device of claims 8, 9, or 10 wherein said sensing means further comprises logic circuit means for preventing said sensing means output signal during said first duration of time, said preventing means being responsive to the said pulse generator.

13. The device of claim 1 wherein said atoms are hydrogen and said stimulating means generates a stimulating signal having a frequency near the ground state hyperfine transition frequency of hydrogen.

14. The maser clock of claim 1 wherein said means for comparing comprises means, which are reset in synchronism with one of said oscillator and maser output signals, for counting the number of zero crossings of the other of said oscillator and maser output signals.

15. The device of claim 14 wherein said counting means comprises an up-down counter reset in synchronism with said oscillator output signal and connected to sense the zero crossings of said maser output signal.

16. A method for generating an atomic clock standard frequency by free induction using an oscillator generating an oscillator signal, comprising:

injecting atoms of a selected magnetic spin orientation into a maser cavity;

stimulating coherent emission from said atoms for a first duration of a time by introducing a stimulating signal referenced to said oscillator signal into said cavity;

permitting said coherent emission to freely oscillate in said cavity in the absence of external stimulation during a second duration of time;

sensing said coherent emission during said second duration of time;

generating a maser output signal in response to said sensing step which is substantially unaffected by the frequency or phase of said stimulating signal;

comparing the frequency of said maser output signal with the frequency of said oscillator signal and generating a difference signal in response thereto; and changing the frequency of said oscillator signal so as to null said difference signal.

17. The method of claim 16 wherein said stimulating step comprises:

frequency multiplying said oscillator signal to generate said stimulating signal;

generating a pulse having a pulse width equal to said first duration of time;

gating said stimulating signal into said cavity in synchronism with said pulse.

18. The method of claim 17 wherein said comparing step comprises:

substracting said multiplied frequency from the frequency of said coherent emission to generate a difference frequency output;

sensing said difference frequency output; and changing the frequency of said oscillator signal in response to said sensing step so as to null said difference frequency output.

19. A method for reducing frequency and phase distortion in an externally stimulated maser, comprising:

temporarily exciting atoms in said maser with external excitation;

allowing said atoms to radiate in said maser free of any external excitation for a duration of time;

sensing the radiation of said atoms only during said duration of time; and, generating a maser output signal in response to said sensing step which is substantially unaffected by the frequency or phase of said external excitation;

comparing the frequency of said maser output signal with the frequency of said external excitation, said comparing step including the step of synthesizing at least one of said external excitation and said maser output signal, and generating a difference signal in response to said comparing step; and changing the frequency of said external excitation so as to null said difference signal.

20. The method of claims 16 or 19 wherein said comparison step comprises counting the zero crossing of one of said maser output and oscillator signals occurring during a period defined by the frequency of the other of said maser output and oscillator signals.

21. The method of claim 20 wherein said counting step comprises resetting an up-down counter in synchronism with said oscillator signal and accumulating counts in said up-down counter in synchronism with said maser output signal.

* * * * *